US009891987B2

(12) United States Patent
Kodera et al.

(10) Patent No.: US 9,891,987 B2
(45) Date of Patent: Feb. 13, 2018

(54) MEMORY DEVICE THAT COMMUNICATES ERROR CORRECTION RESULTS TO A HOST

(71) Applicant: TOSHIBA MEMORY CORPORATION, Tokyo (JP)

(72) Inventors: Shunsuke Kodera, Yokohama Kanagawa (JP); Toshihiko Kitazume, Kawasaki Kanagawa (JP); Kenichirou Kada, Yokohama Kanagawa (JP); Nobuhiro Tsuji, Yokohama Kanagawa (JP); Shinya Takeda, Yokohama Kanagawa (JP); Tetsuya Iwata, Yokohama Kanagawa (JP); Yoshio Furuyama, Yokosuka Kanagawa (JP); Hirosuke Narai, Meguro Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/061,977

(22) Filed: Mar. 4, 2016

(65) Prior Publication Data

US 2017/0060676 A1 Mar. 2, 2017

(30) Foreign Application Priority Data

Aug. 28, 2015 (JP) .................. 2015-169708

(51) Int. Cl.
*G06F 11/10* (2006.01)
*G06F 13/42* (2006.01)
*G11C 29/52* (2006.01)

(52) U.S. Cl.
CPC ...... *G06F 11/1044* (2013.01); *G06F 11/1072* (2013.01); *G06F 13/4282* (2013.01); *G11C 29/52* (2013.01)

(58) Field of Classification Search
CPC ............. G06F 11/1044; G06F 11/1048; G06F 11/1068; G06F 11/1072; G06F 13/4282; G11C 29/52
See application file for complete search history.

(56) References Cited

U.S. PATENT DOCUMENTS 8,219,882 B2 7/2012 Tamura et al.
8,427,871 B2 * 4/2013 Han .................... G06F 11/1048
365/185.09

(Continued)

FOREIGN PATENT DOCUMENTS

JP 4775969 B2 9/2011
JP 2013222315 A 10/2013
JP 2014137833 A 7/2014

OTHER PUBLICATIONS

Toshiba MOS Digital Integrated Circuit Silicon Gate CMOS, TC58NVG0S3HTA00, Aug. 31, 2012, 51 pages.

(Continued)

*Primary Examiner* — Shelly A Chase
(74) *Attorney, Agent, or Firm* — Patterson & Sheridan, LLP

(57) ABSTRACT

A memory device includes a semiconductor memory unit, a controller configured to communicate with a host through a serial interface and read data stored in a page of the semiconductor memory unit in response to a read command received through the serial interface, and an error-correcting code (ECC) circuit configured to carry out error correction with respect to data read from each unit region of the page. The controller is further configured to transmit, through the serial interface to the host, information that indicates whether or not a number of error bits detected by the ECC circuit in the data read from each unit region of the page through the error correction is greater than a predetermined value.

20 Claims, 21 Drawing Sheets

(56) References Cited

U.S. PATENT DOCUMENTS

| | | |
|---|---|---|
| 9,170,893 B2 | 10/2015 | Okubo et al. |
| 2008/0072119 A1 | 3/2008 | Rozman |
| 2011/0119561 A1* | 5/2011 | Lee .................... G06F 11/1068 |
| | | 714/764 |
| 2016/0035417 A1* | 2/2016 | Park .................... G11C 13/004 |
| | | 365/148 |

OTHER PUBLICATIONS

Toshiba MOS Digital Integrated Circuit Silicon Gate CMOS, TC58BVG0S3HTA00, Aug. 31, 2012, 44 pages.
NAND Flash Memory, Serial Peripheral Interface (SPI), MT29F1G01AAADD, 43 pages, 2010.

\* cited by examiner

FIG. 3

| Pin no. | Pin function |
|---|---|
| 1 | Hold input(/HOLD) / serial data output3(SO3) |
| 2 | Power supply(Vcc) |
| 3 | No connection(NC) |
| 4 | No connection(NC) |
| 5 | No connection(NC) |
| 6 | No connection(NC) |
| 7 | Chip select(/CS) |
| 8 | Serial data output(SO) / serial data output1(SO1) |
| 9 | Write protect(/WP) / serial data output2(SO2) |
| 10 | Ground(Vss) |
| 11 | No connection(NC) |
| 12 | No connection(NC) |
| 13 | No connection(NC) |
| 14 | No connection(NC) |
| 15 | Serial data input(SI) / serial data output0(SO0) |
| 16 | Serial clock input(SCK) |

FIG. 4

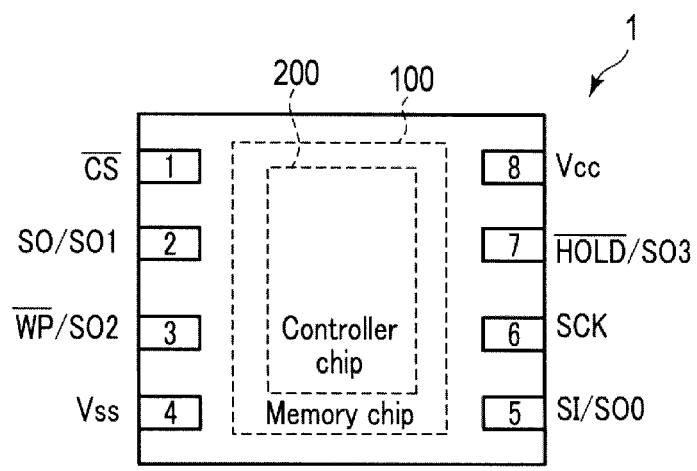

FIG. 5

| Pin no. | Pin function |
|---|---|
| 1 | Chip select(/CS) |
| 2 | Serial data output(SO) / serial data output1(SO1) |
| 3 | Write protect(/WP) / serial data output2(SO2) |
| 4 | Ground(Vss) |
| 5 | Serial data input(SI) / serial data output0(SO0) |
| 6 | Serial clock input(SCK) |
| 7 | Hold input(/HOLD) / serial data output3(SO3) |
| 8 | Power supply(Vcc) |

| Address | Bit | | | | | | | |
|---|---|---|---|---|---|---|---|---|
| | 7 | 6 | 5 | 4 | 3 | 2 | 1 | 0 |
| C0h | Reserved | Reserved | ECCS1 (R) | ECCS0 (R) | PRG_F (R) | ERS_F (R) | WEL (B/W) | OIP (R) |
| 10h | BFD3 (B/W) | BFD2 (B/W) | BFD1 (B/W) | BFD0 (B/W) | Reserved | Reserved | Reserved | Reserved |
| 20h | Reserved | Reserved | Reserved | Reserved | BFS3 (R) | BFS2 (R) | BFS1 (R) | BFS0 (R) |

FIG. 18

| BFD3 | BFD2 | BFD1 | BFD0 | Description |
|---|---|---|---|---|
| 0 | 0 | 0 | 1 | 1 bit in a sector |
| 0 | 0 | 1 | 0 | 2 bit in a sector |
| 0 | 0 | 1 | 1 | 3 bit in a sector |
| 0 | 1 | 0 | 0 | 4 bit in a sector |
| 0 | 1 | 0 | 1 | 5 bit in a sector |
| 0 | 1 | 1 | 0 | 6 bit in a sector |
| 0 | 1 | 1 | 1 | 7 bit in a sector |
| 1 | 0 | 0 | 0 | 8 bit in a sector |
| 1 | 1 | 1 | 1 | 9 + bit in a sector (Error uncorrectable) |

FIG. 19

| | |
|---|---|
| BFS0 | Bit error exceeds the threshold in the sector 0<br>0b: Bit error not exceed<br>1b: Bit error exceeds |
| BFS1 | Bit error exceeds the threshold in the sector 1<br>0b: Bit error not exceed<br>1b: Bit error exceeds |
| BFS2 | Bit error exceeds the threshold in the sector 2<br>0b: Bit error not exceed<br>1b: Bit error exceeds |
| BFS3 | Bit error exceeds the threshold in the sector 3<br>0b: Bit error not exceed<br>1b: Bit error exceeds |

FIG. 23

| Address | Bit | | | | | | | |
|---|---|---|---|---|---|---|---|---|
| | 7 | 6 | 5 | 4 | 3 | 2 | 1 | 0 |
| 40h | BFR7 (R) | BFR6 (R) | BFR5 (R) | BFR4 (R) | BFR3 (R) | BFR2 (R) | BFR1 (R) | BFR0 (R) |
| 50h | BFR15 (R) | BFR14 (R) | BFR13 (R) | BFR12 (R) | BFR11 (R) | BFR10 (R) | BFR9 (R) | BFR8 (R) |

FIG. 24

| BFR3 | BFR2 | BFR1 | BFR0 | Description |
|---|---|---|---|---|
| 0 | 0 | 0 | 0 | No bit error is detected in the page |
| 0 | 0 | 0 | 1 | 1 bit error occurred in sector 0 and corrected |
| 0 | 0 | 1 | 0 | 2 bit errors occurred in sector 0 and corrected |
| 0 | 0 | 1 | 1 | 3 bit errors occurred in sector 0 and corrected |
| 0 | 1 | 0 | 0 | 4 bit errors occurred in sector 0 and corrected |
| 0 | 1 | 0 | 1 | 5 bit errors occurred in sector 0 and corrected |
| 0 | 1 | 1 | 0 | 6 bit errors occurred in sector 0 and corrected |
| 0 | 1 | 1 | 1 | 7 bit errors occurred in sector 0 and corrected |
| 1 | 0 | 0 | 0 | 8 bit errors occurred in sector 0 and corrected |
| 1 | 1 | 1 | 1 | Errors over 8 bits occurred in sector 0 and were not corrected |

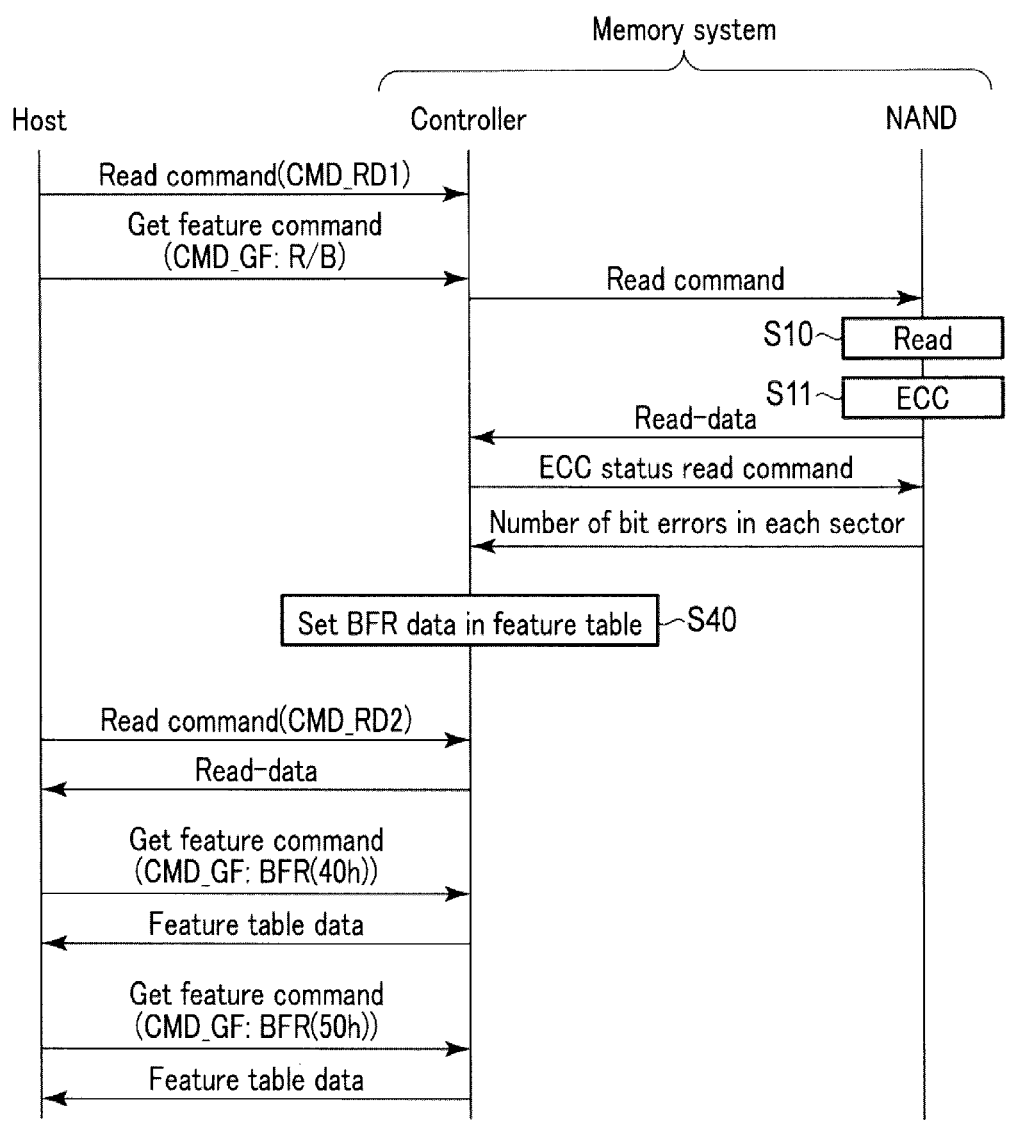

MEMORY DEVICE THAT COMMUNICATES ERROR CORRECTION RESULTS TO A HOST

CROSS-REFERENCE TO RELATED APPLICATION

This application is based upon and claims the benefit of priority from Japanese Patent Application No. 2015-169708, filed Aug. 28, 2015, the entire contents of which are incorporated herein by reference.

FIELD

Embodiments described herein relate generally to a memory device, in particular, a memory device that communicates error correction results to a host.

BACKGROUND

NAND-type flash memory is widely known as a memory device.

DESCRIPTION OF THE DRAWINGS

FIG. 3 illustrates functions of external terminals of the memory system according to the first embodiment.

FIG. 4 is an exterior plan view of another memory system according to the first embodiment.

FIG. 5 illustrates functions of external terminals of the memory system shown in FIG. 4.

FIGS. 18 and 19 each illustrate content of information held in the feature table according to the first embodiment.

FIG. 23 is a schematic diagram of a feature table according to a second embodiment.

FIG. 24 illustrates content of information held in the feature table according to the second embodiment.

FIG. 25 is a timing chart of various signals during setting of information in the feature table according to the second embodiment.

DETAILED DESCRIPTION

Figure 1:
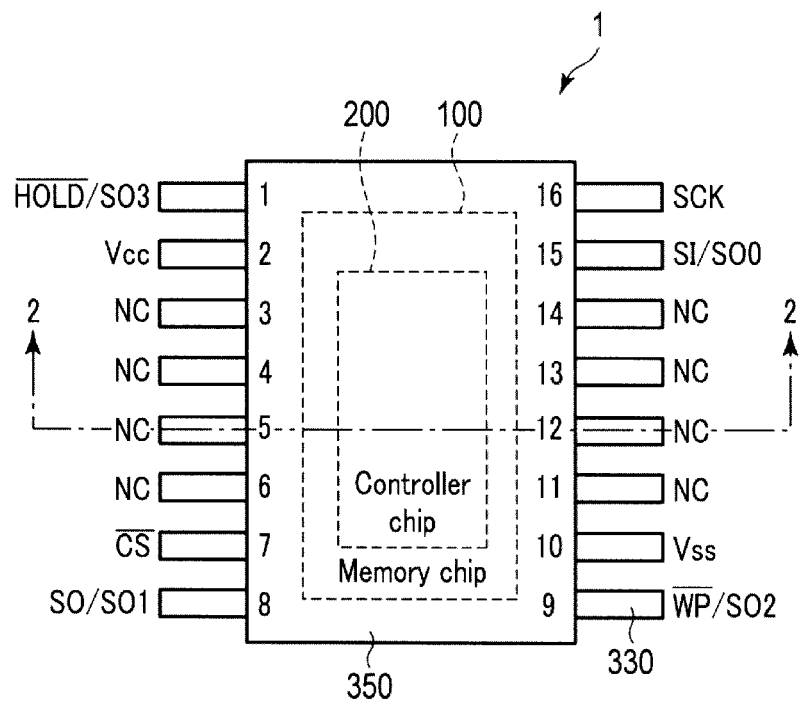
FIG. 1 is an exterior plan view of a memory system according to a first embodiment.

One or more embodiments provide a memory system capable of reducing work load on a host apparatus.

In general, according to an embodiment, a memory device includes a semiconductor memory unit, a controller configured to communicate with a host through a serial interface and read data stored in a page of the semiconductor memory unit in response to a read command received through the serial interface, and an error-correcting code (ECC) circuit configured to carry out error correction with respect to data read from each unit region of the page. The controller is further configured to transmit, through the serial interface to the host, information that indicates whether or not a number of error bits detected by the ECC circuit in the data read from each unit region of the page through the error correction is greater than a predetermined value.

Hereinafter, embodiments will be described with reference to the drawings. In the following description, configuring elements having the same function and configuration are described with common reference numerals.

1. First Embodiment

A memory system according to a first embodiment will be described.

1.1 Configuration 1.1.1 Entire Configuration of Memory System

First, an entire configuration of the memory system according to the present embodiment will be described with reference to FIGS. 1 and 2. FIG. 1 is an exterior plan view of the memory system according to the present embodiment, and FIG. 2 is a cross-sectional view thereof taken along the line II-II in FIG. 1.

As illustrated, a memory system 1 includes two semiconductor chips (modules) 100 and 200. The semiconductor chip (memory chip) 100 includes a semiconductor memory such as a NAND-type flash memory, and the semiconductor chip 200 (controller chip) includes a controller which controls the memory chip 100. The semiconductor chips 100 and 200 are mounted on a lead frame 300, and are packaged by being sealed with a resin 350.

Figure 2:
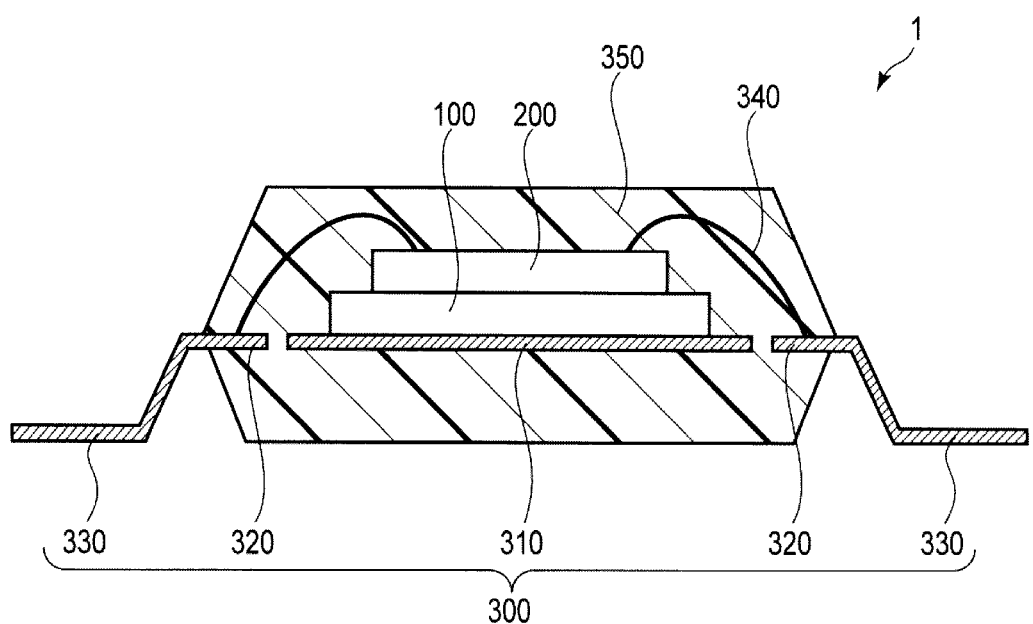
FIG. 2 is a cross-sectional view of the memory system according to the first embodiment.

More specifically, as illustrated in FIG. 2, the memory chip 100 is mounted on a die pad 310 of the lead frame 300, and the controller chip 200 is superposed on the memory chip 100.

The controller chip 200 is connected to an inner lead 320 of the lead frame via, for example, a bonding wire 340, and is also connected to the memory chip 100 via a bonding wire (not illustrated). The memory chip 100, the controller chip 200, the die pad 310, the inner lead 320, and the bonding wire 340 are sealed with, for example, the resin 350.

The inner lead 320 is connected to an outer lead 330 which is exposed to the outside of the resin 350. The outer lead 330 functions as an external connection terminal (external connection pin) of the memory system 1. In FIG. 1, sixteen external connection terminals including a first pin to a sixteenth pin are provided. The memory system 1 performs communication with a host apparatus which controls the memory system. 1 (more specifically, accesses the memory chip) via the pins.

FIG. 3 illustrates functions of the respective pins. As illustrated, the first pin is used to receive a control signal /HOLD, or to output serial data SO3. The control signal /HOLD is asserted (has an "L" level) when communication between the host apparatus and the memory system 1 is temporarily stopped. The second pin receives a power supply voltage Vcc. The third to sixth pins and the eleventh to fourteenth pins are reserved pins, and may be used, for example, when a certain signal or data are required to be transmitted and received in the future. The seventh pin receives a chip select signal /CS. The chip select signal /CS is a signal for activating the memory chip 100 and the controller chip 200 (in other words, a signal is asserted when accessing the memory system 1), and is asserted (has an "L" level), for example, at a timing at which the host apparatus inputs a command to the memory system 1. The eighth pin is used to output serial data (SO or SO1). The ninth pin is used to receive a control signal /WP or to output serial data (SO2). The control signal /WP is a write protect signal, and is asserted (has an "L" level) when writing to the memory chip is inhibited. The tenth pin receives a reference potential Vss. The fifteenth pin is used to receive serial data (SI) or to output serial data (SO0). The sixteenth pin receives a serial clock signal SCK.

The pin configuration conforms to the serial peripheral interface (SPI). The first pin, the eighth pin, the ninth pin, and the fifteenth pin are arbitrarily selected for use in outputting serial data, and can output data to the host apparatus at 1-time speed, 2-time speed or 4-time speed.

FIG. 4 illustrates an example of a package configuration which is different from the one illustrated in FIG. 1. In FIG. 4, eight external connection terminals including a first pin to an eighth pin are provided. FIG. 5 illustrates functions of the respective pins shown in FIG. 4.

As illustrated, the first pin receives the chip select signal /CS. The second pin outputs the serial data SO and SO1. The third pin receives the write protect signal /WP or outputs the serial data SO2. The fourth pin receives the reference potential Vss. The fifth pin receives the serial data SI or outputs the serial data SO0. The sixth pin receives the serial clock. The seventh pin receives the control signal /HOLD or outputs the serial data SO3. The eighth pin receives the power supply voltage Vcc. Also in this case, the pin configuration conforms to the SPI.

Figure 6:
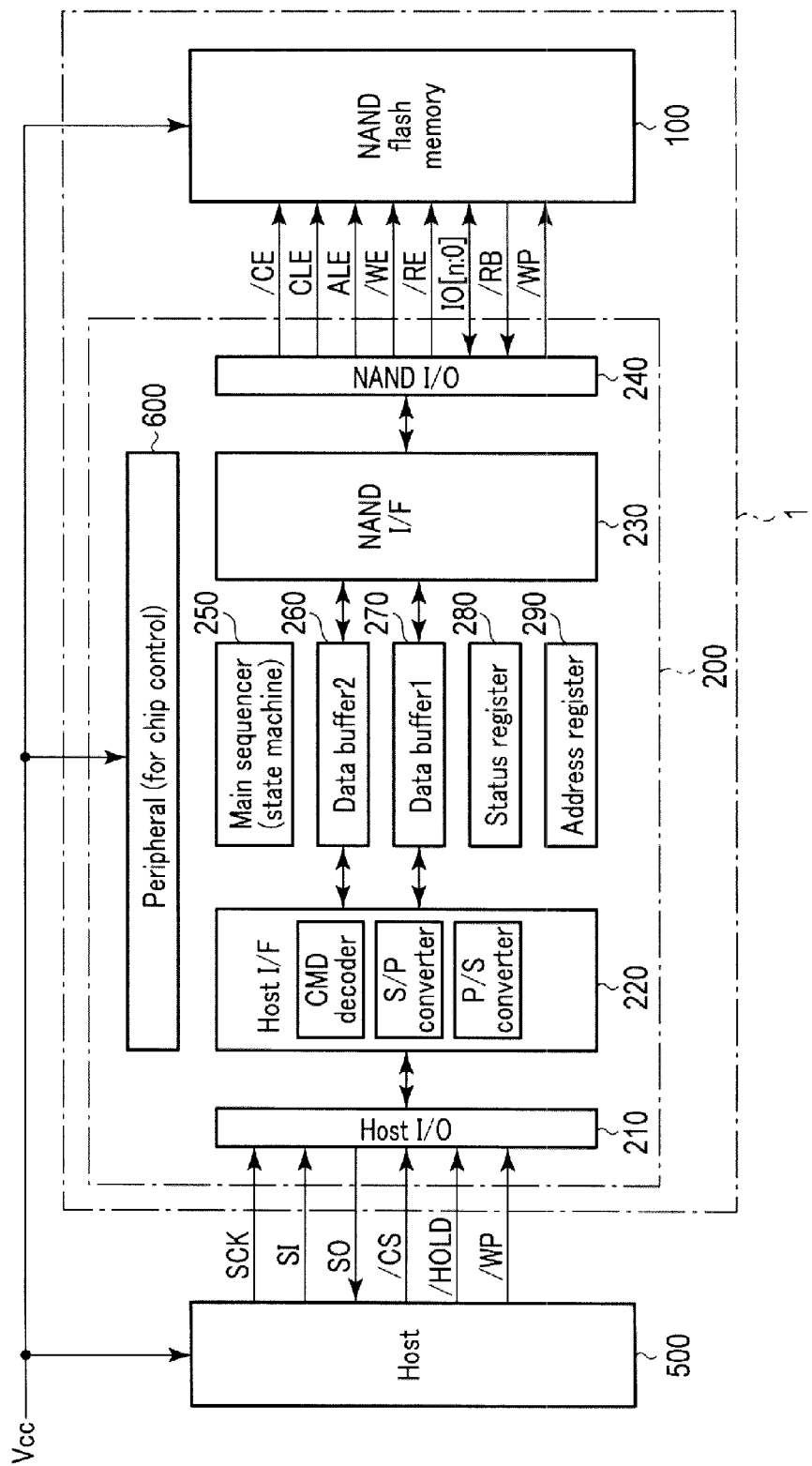
FIG. 6 is a block diagram of the memory system according to the first embodiment.

FIG. 6 is a functional block diagram illustrating an internal configuration of the memory system 1. Hereinafter, the memory chip 100 is referred to as a NAND-type flash memory 100, and the controller chip 200 is simply referred to as a controller 200.

As illustrated, the memory system 1 includes the NAND-type flash memory 100 and the controller 200.

The NAND-type flash memory 100 includes a plurality of memory cells and stores data in a nonvolatile manner. The controller 200 is connected to the NAND-type flash memory 100 via NAND buses, and connected to a host apparatus 500 via SPI buses. The controller 200 controls access to the NAND-type flash memory 100.

Each of the NAND buses performs transmission and reception of signals based on a NAND interface protocol. Specific examples of the signals include a chip enable signal /CE, an address latch enable signal ALE, a command latch enable signal CLE, a write enable signal /WE, a read enable signal /RE, a ready busy signal /RB, an input or output signal I/O, and a write protect signal /WP.

The signal /CE is asserted in a low level so as to activate the NAND-type flash memory 100, when accessing the NAND-type flash memory 100. The signals CLE and ALE are used to notify the NAND-type flash memory 100 that input signals I/O to the NAND-type flash memory 100 are respectively a command and an address. The signal /WE is asserted in a low level so that the input signal I/O is input to the NAND-type flash memory 100. The signal /RE is also asserted in a low level so that the output signal I/O is read from the NAND-type flash memory 100. The ready busy signal /RB indicates whether the NAND-type flash memory 100 is in a ready state (a state of being capable of receiving a command from the controller 200) or in a busy state (a state of being incapable of receiving a command from the controller 200), and a low level thereof indicates the busy state. The input or output signal I/O is, for example, an 8-bit (n=8) signal. The input or output signal I/O is the entity of data which are transmitted and received between the NAND-type flash memory 100 and the controller chip 200, and includes a command, an address, data to be written, and read data. The signal /WP is a signal for inhibiting data from being written to the NAND-type flash memory 100.

The SPI buses are substantially similar to the ones described with reference to FIGS. 3 and 5.

1.1.2 Configuration of Controller 200

Next, with reference to FIG. 6, details of a configuration of the controller 200 will be described. As illustrated, the controller 200 includes a host input/output circuit 210, a host interface circuit 220, a NAND interface circuit 230, a NAND input/output circuit 240, a sequencer (state machine) 250, data buffers 260 and 270, a status register 280, an address register 290, and a peripheral circuit 600.

The host input/output circuit 210 functions as a buffer of signals which are transmitted to and received from the host apparatus 500. The signals SCK, SI, /CS, /HOLD and/WP are first received by the host input/output circuit 210 and are then output to the host interface circuit 220.

The host interface circuit 220 receives the signal SI in synchronization with the signal SCK. The host interface circuit 220 transmits the signal SO which is received in synchronization with the signal SCK, to the host apparatus 500 via the host input/output circuit 210.

The host interface circuit 220 controls transmission and reception of signals with the host apparatus 500 via the host input/output circuit 210. The host interface circuit 220 functions as a serial/parallel converter and a parallel/serial converter. For example, the input signal SI from the host apparatus 500 is converted from a serial signal into a parallel signal, and data read from the NAND-type flash memory 100 is converted from a parallel signal into a serial signal. If the input signal SI is a command, the host interface circuit 220 functions as a command decoder and decodes the received command. A decoded result is output to, for example, the sequencer 250.

The data buffers 260 and 270 temporarily hold data to be written that are received from the host apparatus 500, via the host interface circuit 220. Data read from the NAND-type flash memory 100 are received via the NAND interface circuit 230 and temporarily held.

The status register 280 holds various kinds of status information of the memory system 1. For example, a feature table (described below) is held.

The address register 290 holds an address received from the host apparatus 500, via the host interface circuit 220.

The NAND interface circuit 230 controls transmission and reception of signals to and from the NAND-type flash memory 100 via the NAND input/output circuit 240. The NAND interface circuit 230 issues various commands conforming to the NAND interface protocol in response to a command from the sequencer 250, and outputs the commands to the NAND-type flash memory 100 along with an address in the address register 290 via the NAND input/output circuit 240. During writing of data, the data in the data buffer 260 and/or 270 is output to the NAND-type flash memory 100 via the NAND input/output circuit 240. During reading of data, data read from the NAND-type flash memory 100 is transmitted to the data buffer 260 and/or 270.

The NAND input/output circuit 240 functions as a buffer of signals which are transmitted to or received from the NAND-type flash memory 100. The NAND input/output circuit 240 asserts or deasserts the signals /CE, CLE, ALE, /WE, /RE and /WP in response to commands from the NAND interface circuit 230. During reading of data, the NAND input/output circuit 240 temporarily holds a signal IO (read data) and transmits the signal to the NAND interface circuit 230. During writing of data, the NAND input/output circuit 240 temporarily holds a signal IO (data to be written) and transmits the signal to the NAND-type flash memory 100. The ready busy signal /RB is received from the NAND-type flash memory 100 and is transmitted to the NAND interface circuit 230.

The sequencer 250 controls the entire operation of the controller 200. For example, if a data reading request is received from the host apparatus 500, the sequencer 250 instructs the NAND interface circuit 230 to execute an operation for performing a reading operation. If a data writing request is received from the host apparatus 500, the sequencer 250 instructs the NAND interface circuit 230 to execute an operation for performing a reading operation. The feature table in the status register 280 is updated based on status information received from the NAND-type flash memory 100.

The peripheral circuit 600 receives the power supply voltage Vcc from an external device, transmits the voltage to each circuit block, and performs other control which is necessary in an operation of the controller 200.

1.1.3 Configuration of NAND-Type Flash Memory 100

Figure 7:
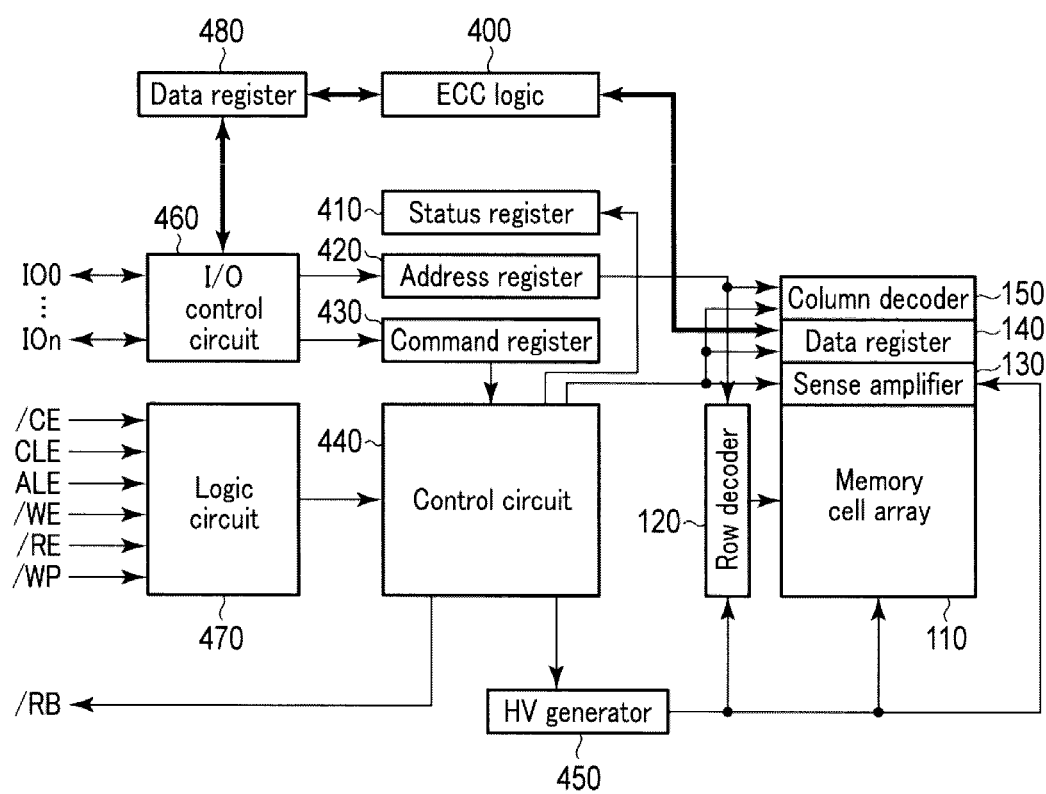
FIG. 7 is a block diagram of a semiconductor memory device according to the first embodiment.

Next, with reference to FIG. 7, a configuration of the NAND-type flash memory 100 will be described. FIG. 7 is a block diagram of the NAND-type flash memory 100.

As illustrated, the NAND-type flash memory 100 includes a memory cell array 110, a row decoder 120, a sense amplifier 130, a data register 140, a column decoder 150, an error correction code (ECC) circuit 400, a status register 410, an address register 420, a command register 430, a control circuit 440, a voltage generation circuit 450, an input/output control circuit 460, a logic circuit 470, and a data register 480.

The memory cell array 110 includes a plurality of non-volatile memory cells arranged in rows and columns. Memory cells in the same row are connected to the same word line, and memory cells in the same column are connected to the same bit line. Reading and writing of data are collectively performed on a plurality of memory cells connected to the same word line. This unit of the reading and writing of data is referred to as a page. Data corresponding to one page includes net data and management data. The net data are managed in the unit called a sector. For example, in the present embodiment, one page includes four sectors, and each sector has a data size of 512 bytes. The management data include, for example, ECC data (parity) for correcting errors. The error correction is performed in each sector. Therefore, the management data include ECC data which are prepared for each sector. Erasing of data is collectively performed in the units of a plurality of pages. The units are referred to as a block.

The row decoder 120 decodes a row address for designating a row of the memory cell array 110. A word line is selected based on a decoded result, and voltages which are required to write, read, and erase data are applied thereto.

During reading of data, the sense amplifier 130 senses data read from the memory cell array 110 and transmits the data to the data register 140. During writing of data, data in the data register 140 are transmitted to the memory cell array 110.

The data register 140 temporarily holds data to be written or read data corresponding to one page.

The column decoder 150 decodes a column address of a column of the memory cell array 110. Based on a decoded result, data are transmitted to the data register during writing of data, and data are read from the data register during reading of data.

The ECC circuit 400 performs error detection and error correction processings. More specifically, during writing of data, the ECC circuit 400 generates parity for each sector based on data received from the controller 200, and transmits the parity and net data to the data register 140. During reading of data, the ECC circuit 400 generates a syndrome for each sector based on parity included in data transmitted from the data register 140, and detects the presence or absence of an error. If an error is detected, a bit position thereof is specified, and the error is corrected. The number of error bits which can be corrected for each sector is, for example, 8 bits per sector in the present embodiment. The ECC circuit 400 may output the number of error bits detected in each sector to the status register 410 as status information.

The logic circuit 470 receives the signals /CE, CLE, ALE, /WE, /RE, and /WP from the controller 200.

The input/output control circuit 460 receives a signal IO [n:0]. If the signal IO is an address (if ALE="H"), the input/output control circuit 460 holds the address in the address register 420. If the signal IO is a command (if CLE="H"), the command is held in the command register 430. If the signal IO is data (if ALE=CLE="L"), the data are held in the data register 480.

The status register 410 holds various kinds of status information of the NAND-type flash memory 100. The status information includes information indicating the number of error bits provided from the ECC circuit 400, and information indicating whether or not a writing operation and an erasing operation are successful (passed) or unsuccessful (failed), provided from the control circuit 440.

The control circuit 440 controls the entire NAND-type flash memory 100 based on commands held in the command register 430 and various signals input to the logic circuit 470. The control circuit 440 generates the ready busy signal /RB and outputs the signal to the controller 200.

The voltage generation circuit 450 generates voltage required in data writing, reading and erasing operations based on a command from the control circuit 440, and supplies the voltages to the memory cell array 110, the row decoder 120, and the sense amplifier 130.

1.2 Operations

Next, data reading, writing, and erasing operations in the memory system according to the present embodiment will be described, focusing on signals which are transmitted and received via the SPI bus and the NAND bus.

1.2.1 Reading Operation

First, the reading operation will be described. The reading operation substantially includes the following three steps.

(1) Reading of data from the NAND-type flash memory: Through this step, data are read from the NAND-type flash memory 100 to the controller 200.

(2) Feature table reading (referred to as Get feature in some cases): Through this step, whether the memory system 1 is in a busy state or a ready state is determined, that is, whether or not the operation in the step (1) is completed is determined.

(3) Reading of data from the controller 200: Through this step, the data read to the controller 200 in the step (1) are read to the host apparatus 500.

Figure 8:
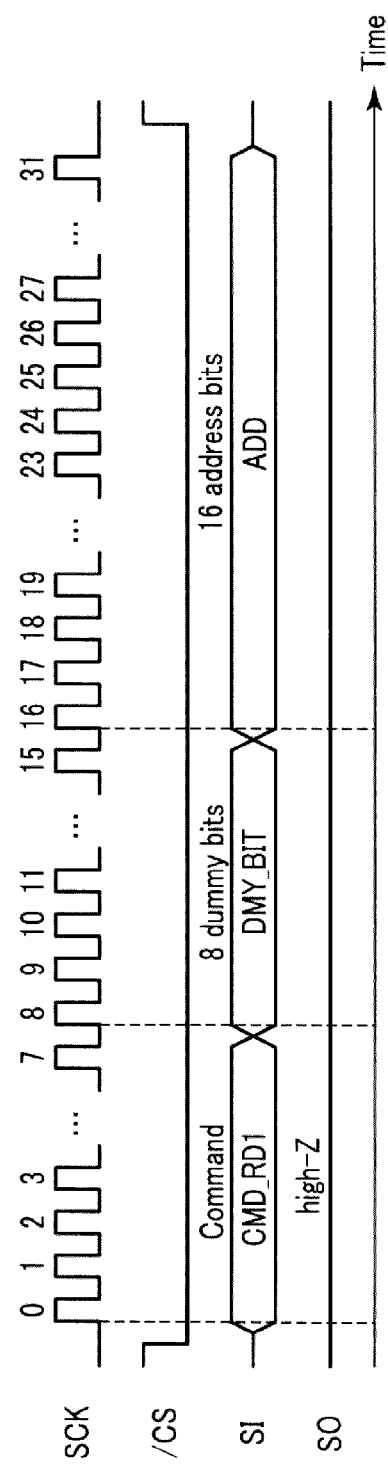
FIGS. 8-11 are timing charts of various signals during reading of data in the memory system according to the first embodiment.

FIG. 8 is a timing chart of various signals on the SPI buses during execution of the step (1). As illustrated, the host apparatus 500 asserts the signal /CS, issues a first read command CMD_RD1 as the signal SI, and also issues the clock SCK.

The host interface circuit 220 of the controller 200 recognizes the signal SI when the signal /CS is asserted and the initial clock SCK is received, as a command. The command is, for example, an 8-bit signal which is input for 8 clock cycles. The first read command CMD_RD1 is received, and then the sequencer 250 starts a data reading sequence.

Next, the host apparatus 500 transmits dummy bits DMY_ BIT to the controller 200, for example, for 8 clock cycles, and then transmits an address ADD to the controller 200, for example, for 16 clock cycles. After the address ADD is transmitted, the host apparatus 500 deasserts the signal /CS. The address ADD is an address for designating a block and a page in the NAND-type flash memory 100, and is held in the address register 290.

As described above, when a specific command is received, what kind of signal is subsequently input (command sequence) is defined in advance. In other words, for example, if the first read command CMD_RD1 is received, the controller 200 recognizes that the signal SI which is input for subsequent 8 clock cycles is meaningless dummy data, and the signal SI which is input for subsequent 16 clock cycles is a substantial address signal.

Figure 9:
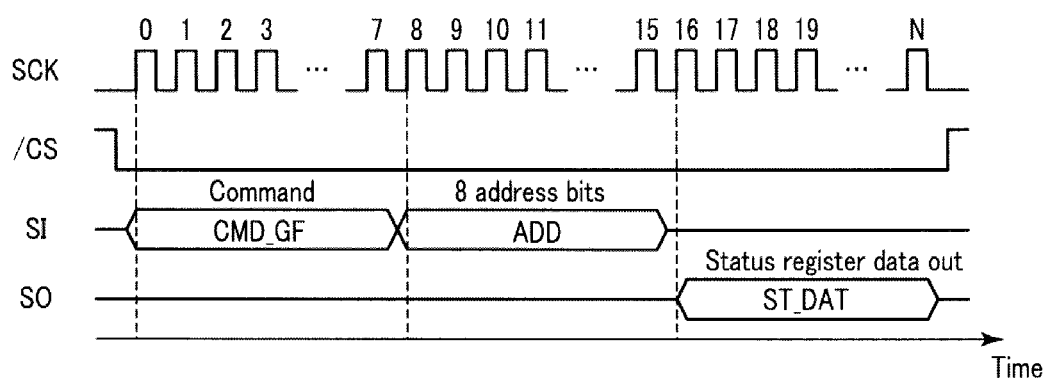

The operation in the step (2) is performed following the operation in the step (1). FIG. 9 is a timing chart of various signals on the SPI buses during execution in the step (2). As illustrated, the host apparatus 500 asserts the signal /CS again, issues a Get feature command CMD_GF as the signal SI, and also issues the clock SCK.

Next, the host apparatus 500 transmits an address ADD to the controller 200, for example, for 8 clock cycles. The address ADD is an address in the feature table, and is an address for naturally designating a region in which ready busy information is stored. In the controller 200, after the address ADD is received, the host interface circuit 220 reads an entry designated in the feature table from the status register 280 in response to a command from the sequencer 250, and transmits the entry to the host apparatus 500 as 8-bit status data ST_DAT for 8 clock cycles. The status data ST_DAT includes the ready busy information. After the status data ST_DAT is received, the host apparatus 500 deasserts the signal /CS.

Figure 10:
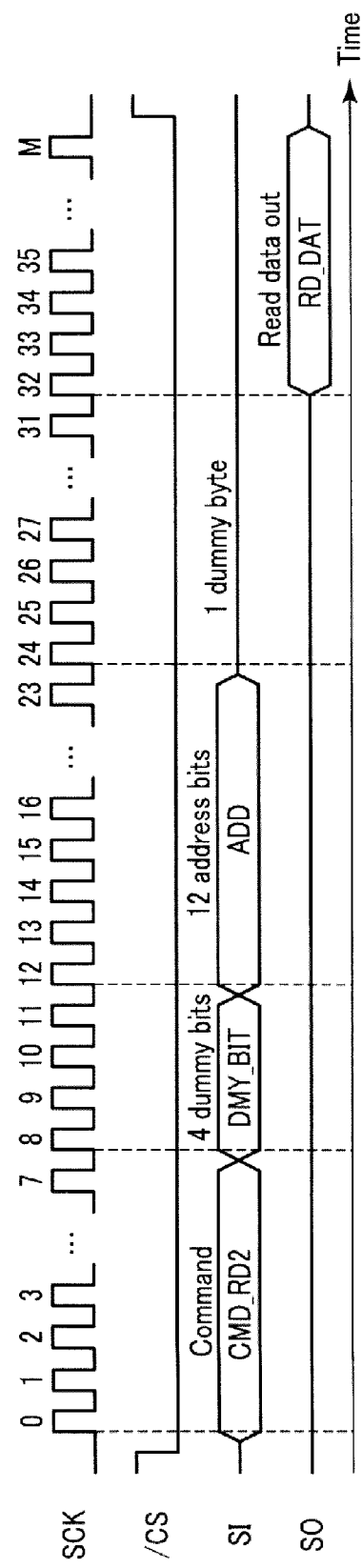

If the received status data ST_DAT indicates that the memory system 1 is in a ready state, the operation in the step (3) is performed. FIG. 10 is a timing chart of various signals on the SPI buses during execution of the step (3). As illustrated, the host apparatus 500 asserts the signal /CS, issues a second read command CMD_RD2 as the signal SI, and also issues the clock SCK.

Next, the host apparatus 500 transmits dummy bits DMY_ BIT to the controller 200, for example, for 4 clock cycles, and then transmits an address ADD to the controller 200, for example, for 12 clock cycles. The address ADD is an address for designating a region in the data buffer 260 or 270 of the controller 200, and is an address for designating a column of a page in the NAND-type flash memory 100. The address ADD is held in the address register 290. Then, the host interface circuit 220 reads data from the data buffer 260 or 270, for example, under the control of the sequencer 250. After the 8 clock cycles, the host interface circuit 220 transmits the data RD_DAT read from the data buffer 260 or 270 to the host apparatus 500.

Figure 11:
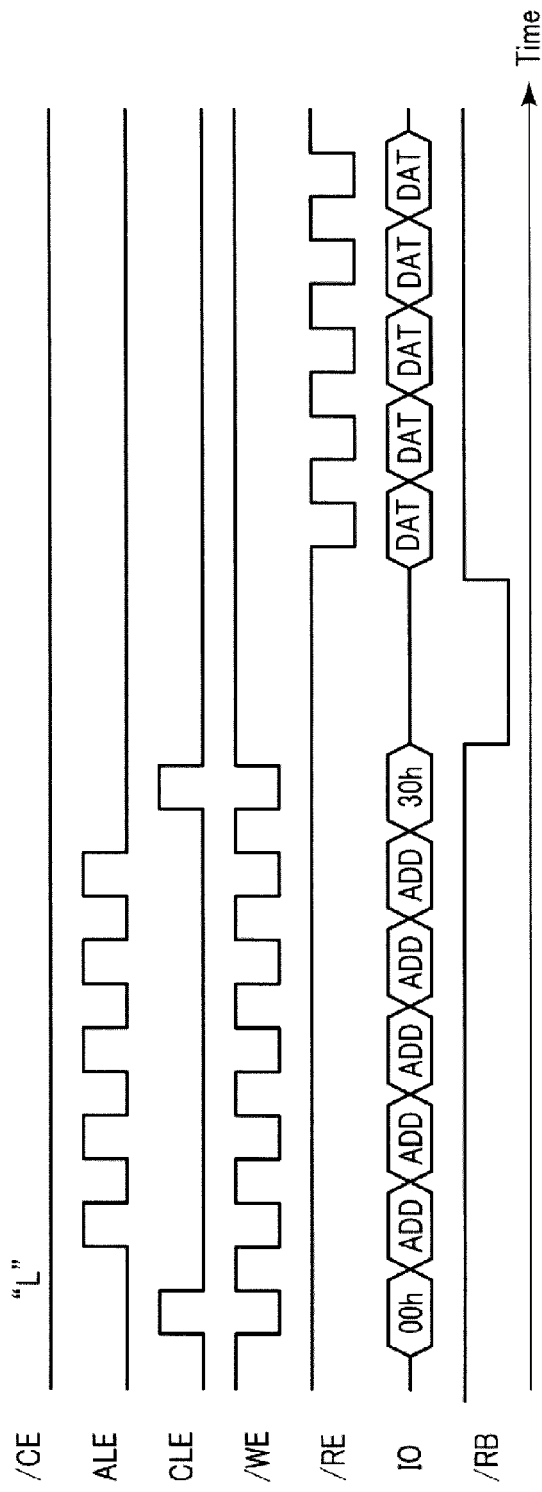

FIG. 11 is a timing chart of various signals on the NAND bus during execution of the step (1). After the first read command CMD_RD1 is received in the controller 200, the NAND interface circuit 230 issues an address input command "00h", for example, under the control of the sequencer 250, and transmits the command to the NAND-type flash memory 100. Subsequently, an address ADD is transmitted to the NAND-type flash memory 100, for example, for 5 clock cycles, and then a read command "30h" is issued and transmitted to the NAND-type flash memory 100. The address ADD includes addresses indicating a block, a page, and a column, held in the address register 290 in the operations illustrated in FIGS. 8 and 10.

An operation of reading data from the memory cell array 110 is started in the NAND-type flash memory 100 in response to the command "30h", and thus the NAND-type flash memory 100 is brought into a busy state (/RB="L").

If reading of the data from the memory cell array 110 is completed, the NAND-type flash memory 100 is brought into a ready state. The controller 200 toggles the signal /RE in response thereto. Then, the data are transmitted from the NAND-type flash memory 100 to the controller 200 in synchronization with the signal /RE.

1.2.2 Writing Operation

Next, the writing operation will be described. The writing operation substantially includes the following three steps.

(1) Transmission of data from the host apparatus 500 to the controller 200

(2) Writing of the transmitted data to the NAND-type flash memory 100

(3) Feature table reading (Get feature): Through this step, whether writing of the data to the NAND-type flash memory 100 is passed or failed is determined.

Figure 12:
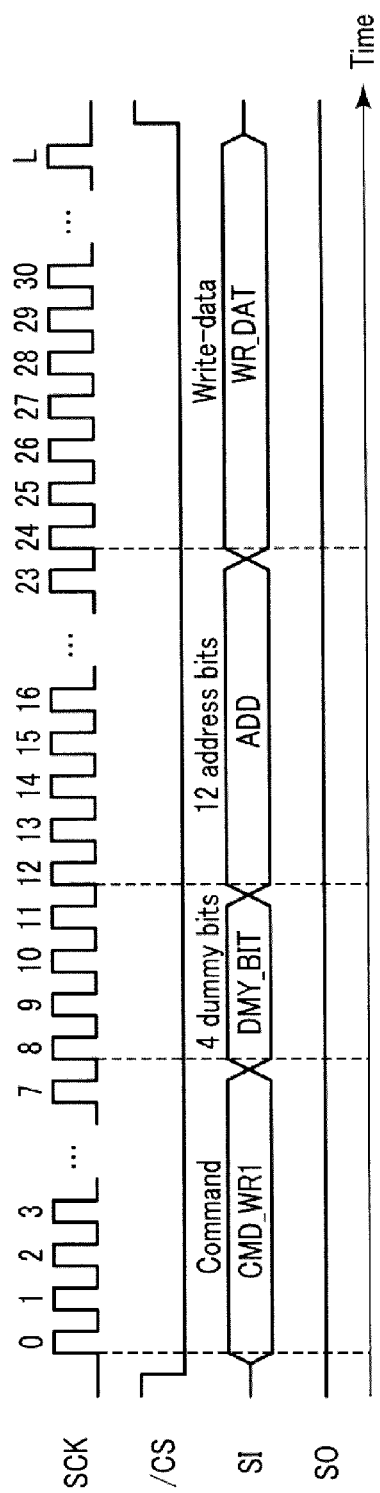
FIGS. 12-14 are timing charts of various signals during writing of data in the memory system according to the first embodiment.

FIG. 12 is a timing chart of various signals on the SPI buses during execution of the step (1). As illustrated, the host apparatus 500 asserts the signal /CS, issues a first write command CMD_WR1 as the signal SI, and also issues the clock SCK. If the first write command CMD_WR1 is received, the sequencer 250 starts a data writing sequence.

Next, the host apparatus 500 transmits dummy bits DMY_ BIT to the controller 200, for example, for 4 clock cycles, and then transmits an address ADD to the controller 200, for example, for 12 clock cycles. The address ADD is an address for designating a region in the data buffer 260 or 270, and is an address for designating a column of a page in the NAND-type flash memory 100. The address ADD is held in the address register 290. The host apparatus 500 transmits data to be written WR_DAT to the controller 200. The data to be written WR_DAT is held in the region corresponding to the address ADD received right before, in the data buffer 260 or 270. After the data WR_DAT is transmitted, the host apparatus 500 deasserts the signal /CS.

Figure 13:
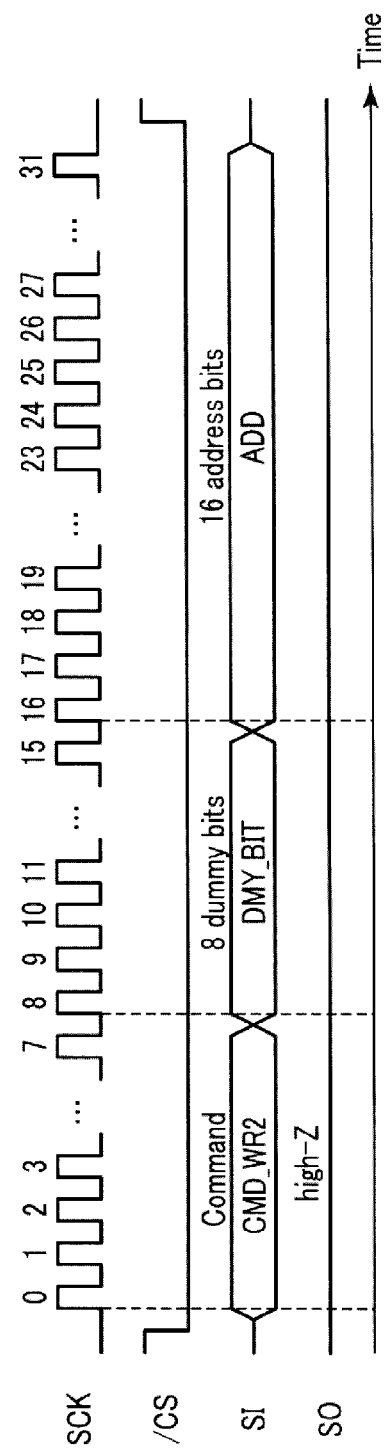

The step (2) is performed following the step (1). FIG. 13 is a timing chart of various signals on the SPI bus during execution of the step (2). As illustrated, the host apparatus 500 asserts the signal /CS again, issues a second write command CMD_WR2 as the signal SI, and also issues the clock SCK. If the second write command CMD_WR2 is received, the sequencer 250 recognizes that a command for the step (2) is received.

Next, the host apparatus 500 transmits 8 dummy bits DMY_BIT to the controller 200, for example, for 8 clock cycles, and then transmits a 16-bit address ADD to the controller 200, for example, for 16 clock cycles. The address ADD is an address for designating a block and a page in the NAND-type flash memory 100, and is held in the address register 290. After the address ADD is transmitted, the host apparatus 500 deasserts the signal /CS.

The step (3) is performed following the step (2). A command sequence in this operation is the same as in FIG. 9 referred to for description of the reading operation. If the received status data ST_DAT indicates that the memory system 1 is in a ready state, the host apparatus 500 subsequently makes a request for information indicating whether writing of data is passed or failed.

Figure 14:
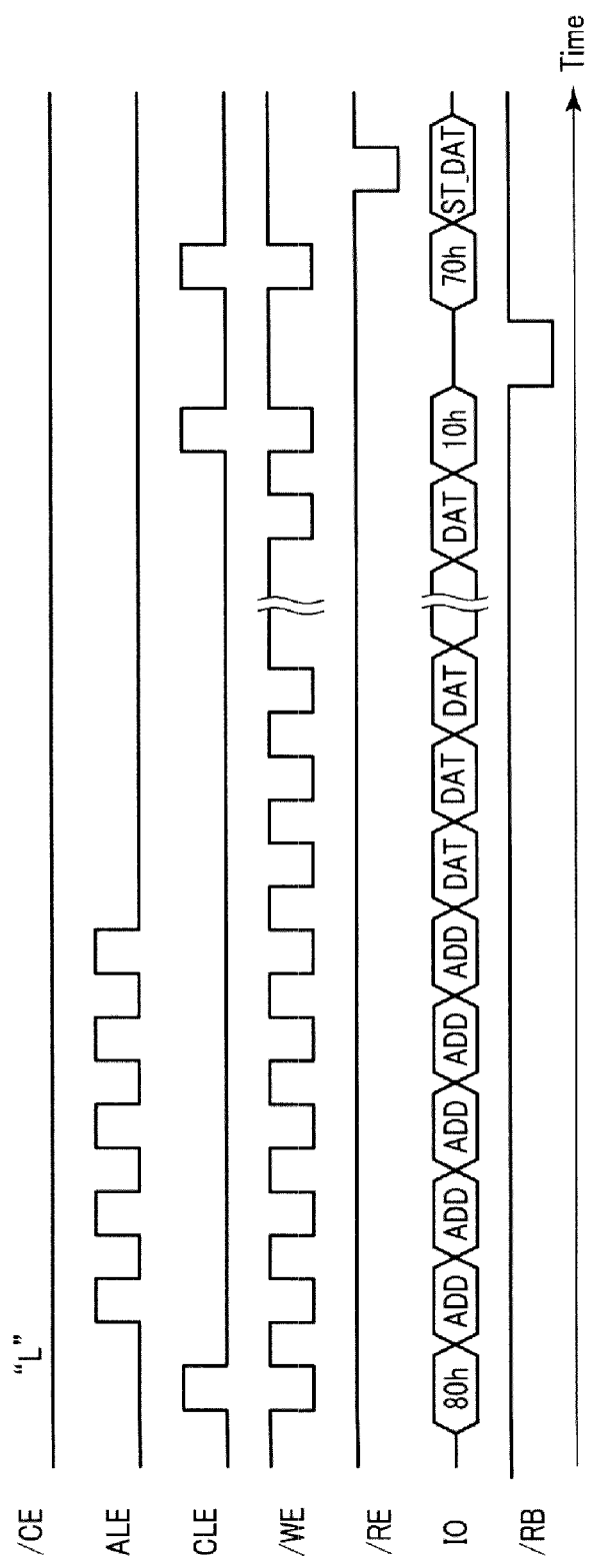

FIG. 14 is a timing chart of various signals on the NAND buses during execution of the step (2). After the second write command CMD_WR2 is received in the controller 200, the NAND interface circuit 230 issues a write command "80h", for example, under the control of the sequencer 250, and transmits the command to the NAND-type flash memory 100. Subsequently, an address ADD is transmitted to the NAND-type flash memory 100, for example, for 5 clock cycles, and data to be written DAT is transmitted to the NAND-type flash memory 100 for a plurality of clock cycles. Then, a write command "10h" is issued and transmitted to the NAND-type flash memory 100. The address ADD includes addresses indicating a block, a page, and a column, held in the address register 290 in the operations illustrated in FIGS. 12 and 13.

An operation of writing the data to the memory cell array 110 is started in the NAND-type flash memory 100 in response to the command "10h", and thus the NAND-type flash memory 100 is brought into a busy state (/RB="L").

If writing of the data to the memory cell array 110 is completed, the NAND-type flash memory 100 is brought into a ready state. The controller 200 issues a status read command "70h", and toggles the signal /RE, in response thereto. Then, status data ST_DAT indicating whether the writing operation is passed or failed is transmitted to the controller 200 in synchronization with the signal /RE. The status data ST_DAT is held in the feature table, and is read to the host apparatus 500 in response to the Get feature command in the step (3).

1.2.3 Erasing Operation

Next, the erasing operation will be described. The erasing operation substantially includes the following two steps.

(1) An erase (delete) command is issued from the host apparatus 500 to the controller 200.

(2) Feature table reading (Get feature): Through this step, whether the erasing operation on the NAND-type flash memory 100 is passed or failed is determined.

Figure 15:
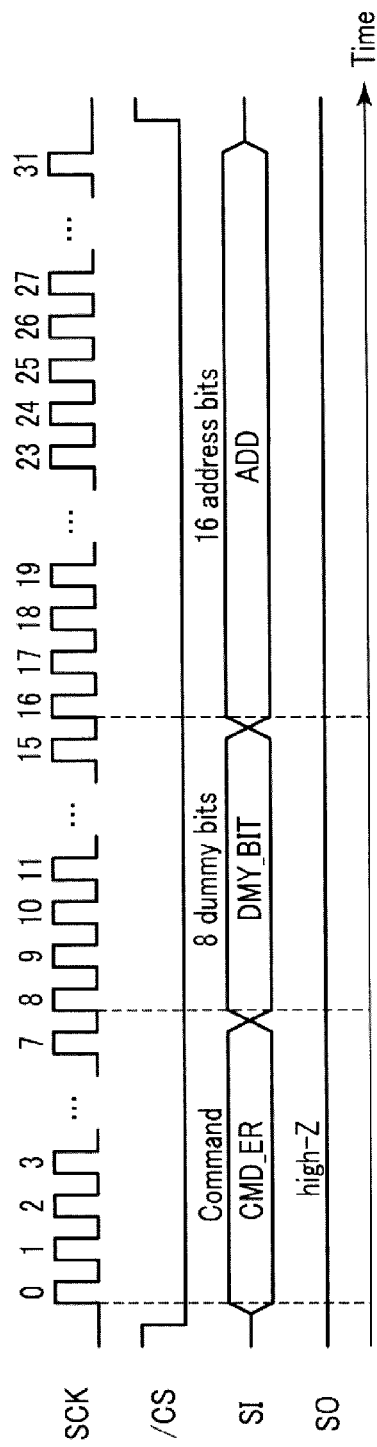
FIGS. 15-16 are timing charts of various signals during erasing of data in the memory system according to the first embodiment.

FIG. 15 is a timing chart of various signals on the SPI buses during execution of the step (1). As illustrated, the host apparatus 500 asserts the signal /CS, issues an erase command CMD_ER as the signal SI, and also issues the clock SCK. If the erase command CMD_ER is received, the sequencer 250 starts a data erasure sequence.

Next, the host apparatus 500 transmits 8 dummy bits DMY_BIT to the controller 200, for example, for 8 clock cycles, and then transmits a 16-bit address ADD to the controller 200, for example, for 16 clock cycles. The address ADD is an address for designating an erasure target block in the memory cell array 110, and is held in the address register 290. Subsequently, the host apparatus 500 deasserts the signal /CS.

The step (2) is performed following the step (1). A command sequence in this operation is the same as in FIG. 9 referred to for description of the reading operation. If the received status data ST_DAT indicates that the memory system 1 is in a ready state, the host apparatus 500 subsequently makes a request for information indicating whether erasure of the data is passed or failed.

Figures 16, 17:
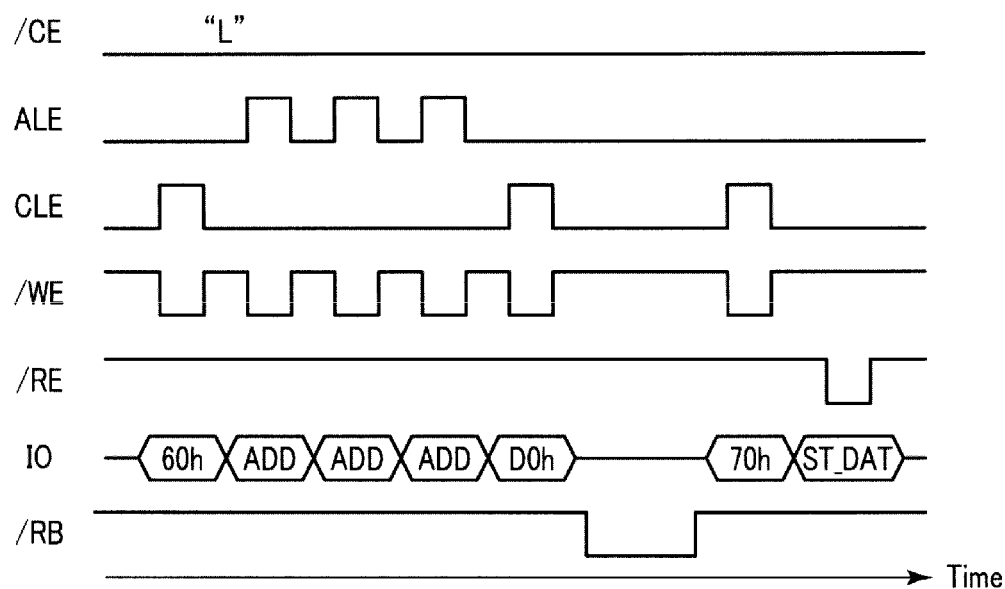
FIG. 17 is a schematic diagram of a feature table according to the first embodiment.

FIG. 16 is a timing chart of various signals on the NAND buses during execution of the step (1). After the erase command CMD_ER is received in the controller 200, the NAND interface circuit 230 issues an erase command "60h", for example, under the control of the sequencer 250, and transmits the command to the NAND-type flash memory 100. Subsequently, an address ADD is transmitted to the NAND-type flash memory 100, for example, for 3 clock cycles, and then an erase command "D0h" is issued and is transmitted to the NAND-type flash memory 100.

An operation of erasing data from the memory cell array 110 is started in the NAND-type flash memory 100 in response to the command "D0h", and thus the NAND-type flash memory 100 is brought into a busy state (/RB="L").

If erasing of the data from the memory cell array 110 is completed, the NAND-type flash memory 100 is brought into a ready state. The controller 200 issues a status read command "70h", and toggles the signal /RE, in response thereto. Then, status data ST_DAT indicating whether the erasing operation is passed or failed is transmitted to the controller 200 in synchronization with the signal /RE. The status data ST_DAT is held in the feature table, and is read to the host apparatus 500 in response to the Get feature command during the step (2).

1.3 Details of Reading Operation and ECC Information

Next, details of the above-described reading operation and details of status information regarding ECC obtained at that time will be described.

1.3.1 Feature Table

FIG. 17 conceptually illustrates the feature table according to the present embodiment. As illustrated, the feature table includes three entries, and each entry has an 8-bit length. The entries are respectively allocated with addresses "C0h", "10h", and "20h".

The following information is allocated to the entry related to the address "C0h" from the lowest bit in order.

Bit 0=operation in progress (OIP): This bit is a flag indicating whether the memory system 1 is in a ready state or a busy state, and indicates the ready state with "0" and the busy state with "1".

Bit 1=write enable latch (WEL): This bit is a flag indicating whether writing of data is enabled or disabled, and indicates a disabled state with "0" and an enabled state with Bit 2=erase fail (ERS_F): This bit is a flag indicating whether or not a data erasing operation is failed, and indicates pass with "0" and failure with "1".

Bit 3=program fail (PRG_F): This bit is a flag indicating whether or not a data programming operation is failed, and indicates pass with "0" and failure with "1"

Bits 4 and 5=ECC status (ECCS): These bits indicate an error correction result in the NAND-type flash memory

100, in which "00" indicates that no error is detected, "01" and "11" indicate that an error is corrected, and "10" indicates that an error cannot be corrected. "01" indicates that the number of corrected error bits is less than a threshold value designed by BFD (described below), and "11" indicates that the number of corrected error bits is equal to or more than the threshold value.

Bits 6 and 7=reserved

The entry related to the address "10h" is as follows.

Bits 0 to 3=reserved

Bits 4 to 7=BFD0 to BFD3: The threshold value of the number of error bits which is set in advance by the host apparatus 500

For example, as illustrated in FIG. 18, a threshold value may be set through a combination of values of BFD0 to BFD3. In other words, if (BFD3, BFD2, BFD1, BFD0) ="0001", the number of error bits as a threshold value is 1 bit per sector. If (BFD3, BFD2, BFD1, BFD0)="0010", the number of error bits as a threshold value is 2 bits per sector. If (BFD3, BFD2, BFD1, BFD0)="0011", the number of error bits as a threshold value is 3 bits per sector, and the same applies hereafter. If (BFD3, BFD2, BFD1, BFD0)="1111", the number of error bits as a threshold value is larger than the number of correctable bits (in the example, equal to or larger than 9 bits).

The entry related to the address "20h" is as follows.

Bits 0 to 3=BFS0 to BFS3: These bits are a flag indicating whether or not the number of error bits detected in respective sectors 0 to 4 is equal to or more than a threshold value set by BFD. As illustrated in FIG. 19, "0" indicates that the number of error bits is less than the threshold value, and "1" indicates that the number of error bits is equal to or more than the threshold value.

Bits 4 to 7=reserved

The feature table is generated by, for example, the sequencer 250, based on information provided from the NAND interface circuit 230 or the host interface circuit 220, and is held in, for example, the status register 280.

1.3.2 Set Feature Command

Values of BFD0 to BFD3 described in FIG. 17 may be arbitrarily set by the host apparatus 500 based on a feature table set command (also referred to as a Set feature command).

Figure 20:
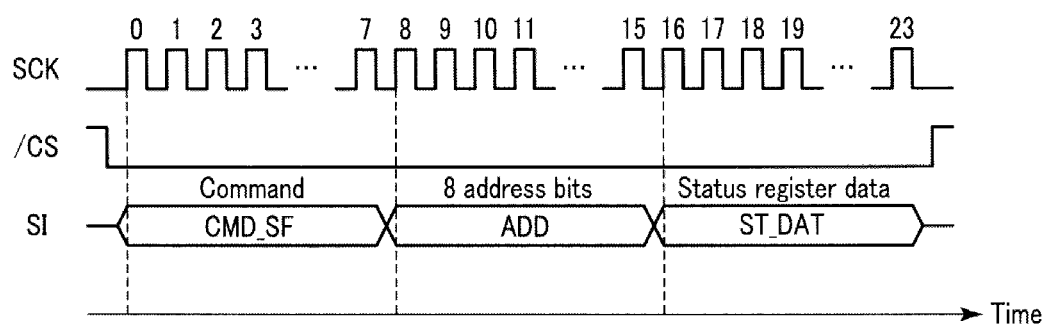
FIG. 20 is a timing chart of various signals during setting of information in the feature table according to the first embodiment.

FIG. 20 is a timing chart of various signals on the SPI buses when values of BFDs are set in the feature table. As illustrated, the host apparatus 500 asserts the signal /CS, issues the Set feature command CMD_SF as the signal SI, and issues the clock SCK.

Next, the host apparatus 500 transmits an address ADD to the controller 200, for example, for 8 clock cycles. The address ADD is an address in the feature table, and is "10h" in FIG. 17. Subsequently, the host apparatus 500 transmits 8-bit data ST_DAT held in the entry corresponding to the address "10h" in the feature table. The upper 4 bits in the 8-bit data ST_DAT are BFD3 to BFD0. Then, the sequencer 250 writes the data ST_DAT into the designated entry in the feature table. Consequently, the BFDs can be arbitrarily set.

1.3.3 Flow of Reading Operation

Figure 21:
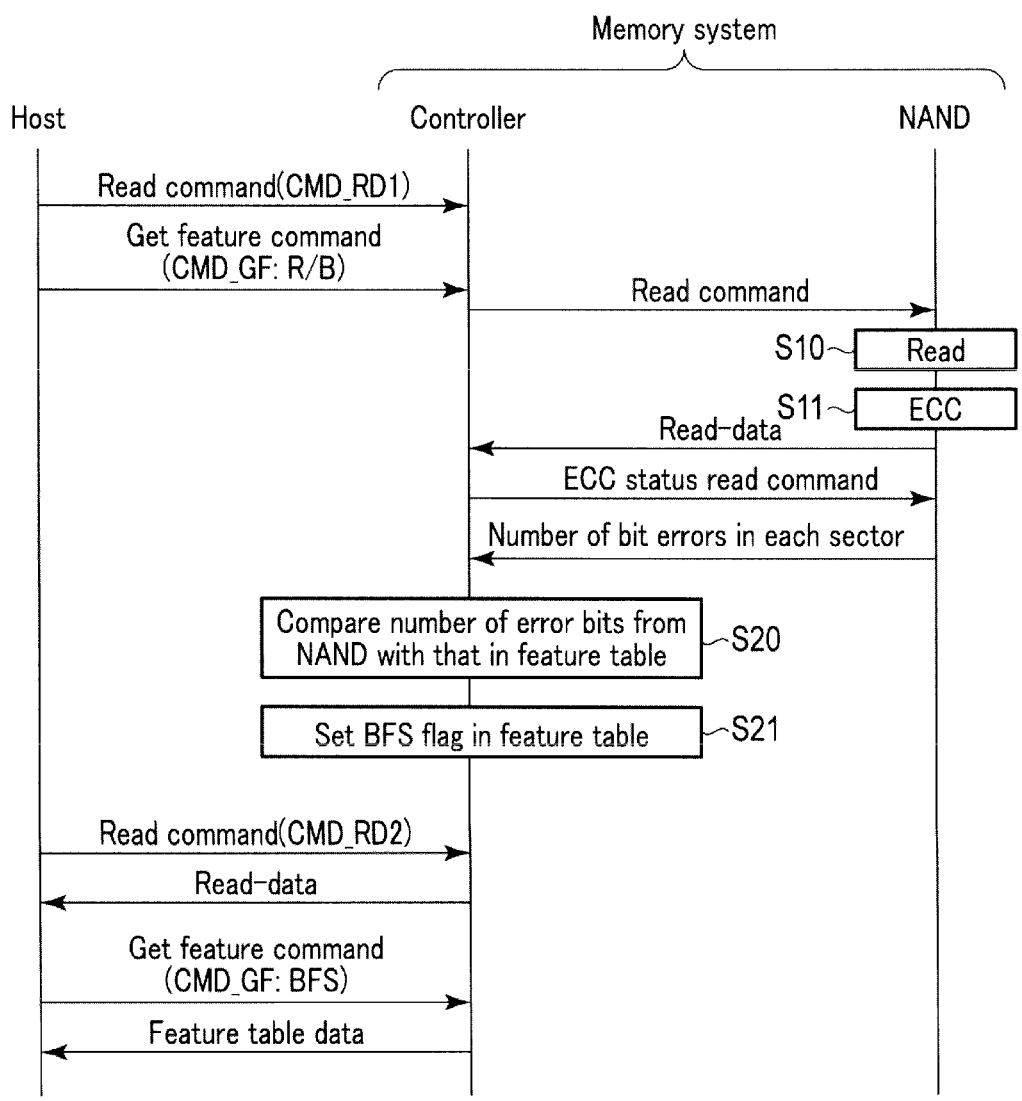
FIG. 21 is a flowchart illustrating a reading operation performed by the memory system according to the first embodiment.
Figure 22:
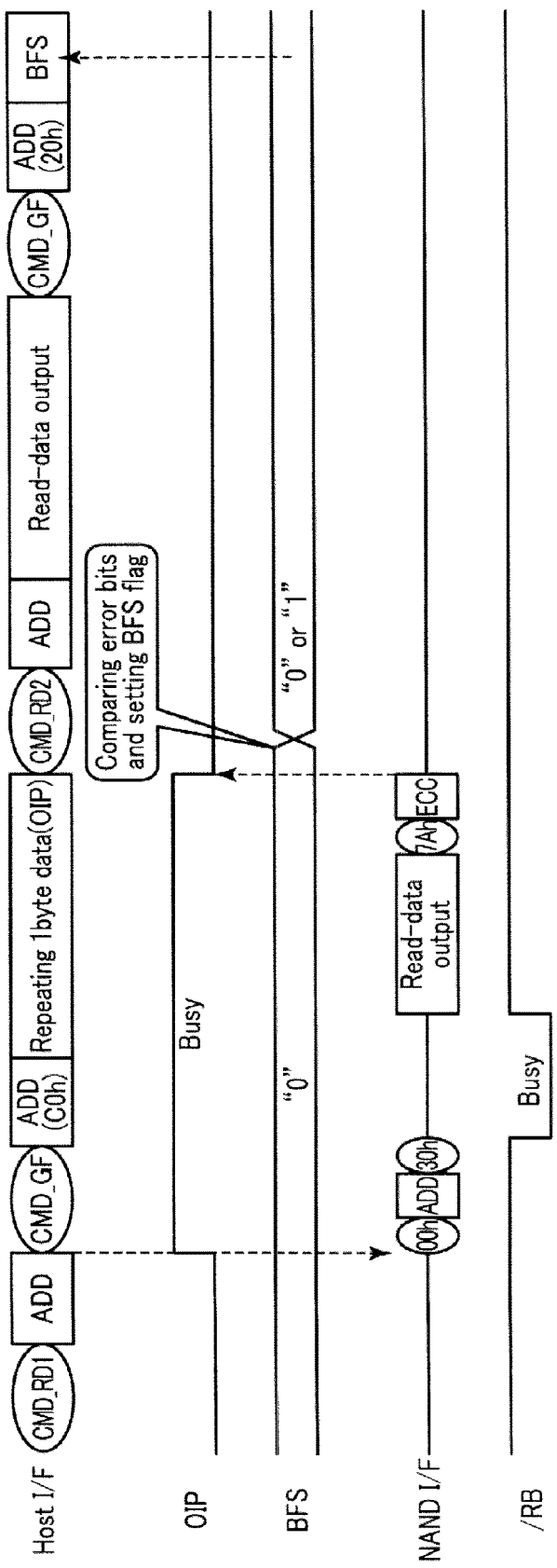
FIG. 22 is a command sequence during the reading operation of the memory system according to the first embodiment.

Next, details of a flow of the reading operation will be described with reference to FIGS. 21 and 22. FIG. 21 is a flowchart illustrating operations of the host apparatus 500, the controller 200, and the NAND-type flash memory 100 during the reading operation, and FIG. 22 illustrates a command sequence.

As illustrated, first, the host apparatus 500 issues the first read command CMD_RD1 and then an address ADD. In response to the address ADD, the memory system 1 is brought into a busy state, and the OIP in the feature table becomes "1". The host apparatus 500 issues the Get feature command CMD_GF and an address ADD (="C0h"), and reads information (1-byte data) regarding the entry including the OIP from the feature table. The entry information is repeatedly transmitted to the host apparatus 500 until the OIP becomes "0" (the Get feature command may be repeatedly issued).

When the memory system 1 is brought into a busy state, the controller 200 issues a command "00h", an address ADD, and a command "30h" to the NAND-type flash memory 100. Consequently, the NAND-type flash memory 100 is brought into a busy state. Data are read from the memory cell array 110 (step S10). Next, the ECC circuit 400 detects an error from the read data, and, if an error is detected, the error is corrected (step S11).

Thereafter, the NAND-type flash memory 100 is brought into a ready state, and the read data are transmitted to the controller 200. Next, the controller 200 issues an ECC status read command "7Ah". Then, in response to the command, the NAND-type flash memory 100 outputs the number of error bits in each sector, detected in the ECC processing in step S11, to the controller 200.

If the number of error bits is transmitted from the NAND-type flash memory 100 to the controller 200, the memory system 1 is brought into a ready state, and, for example, the sequencer 250 sets the OIP in the feature table from "1" to "0". The sequencer 250 compares the number of error bits detected in each sector with the threshold value designated by the BFDs in the feature table (step S20). If there is a sector for which the number of error bits is more than the threshold value designated by the BFDs, the sequencer 250 sets a corresponding BFS flag in the feature table from "0" to "1" (step S21). For example, if the number of error bits detected in the sector 0 is one, the number of error bits detected in the sector 1 is five, the number of error bits detected in the sector 2 is two, the number of error bits detected in the sector 3 is seven, and the threshold value designated by the BFDs is 4, the number of error bits exceeds the threshold value in the sector 1 and the sector 3. Therefore, BFS1 and BFS3 are set as "1".

In response to the OIP becoming "0", the host apparatus 500 issues the second read command CMD_RD2, and reads the read data of which error is corrected by the ECC circuit 400, from the controller 200.

Next, the host apparatus 500 issues the Get feature command CMD_GF and the address ADD (="20h"), and reads information regarding an entry including BFS from the feature table.

1.3 Advantage of Present Embodiment

According to the present embodiment, a load on the host apparatus can be reduced. The advantage of the present embodiment will be described below in detail.

In the NAND-type flash memory, an error bit is generated in some of written data (a bit is reversed). For this reason, if the NAND-type flash memory is to be used, the data error is generally corrected through ECC.

The number of correctable error bits has an upper limit for each circuit in the ECC. On the other hand, in the NAND-type flash memory, if a plurality of reading operations is performed on data which have been once written, the number of error bits tends to increase.

For this reason, the host apparatus performs processing such as transfer of the data to other blocks before an error cannot be corrected by the ECC circuit due to the increase of the number of error bits. This processing is referred to as refresh processing.

In terms of this point, according to the present embodiment, the memory system 1 compares a predetermined threshold value set in the feature table with the number of error bits which is actually detected. The memory system 1 can notify the host apparatus of whether or not the number of error bits is equal to or more than the threshold value, using the flag BFS. Since the threshold value is information known to the host apparatus 500, the host apparatus 500 can determine to what extent data in the memory cell of the NAND-type flash memory 100 deteriorate through the flag BFS, and can determine whether or not refresh is required based on a determination result thereof. The host apparatus 500 is not required to compare the threshold value with the number of error bits at this time. Therefore, a load on the host apparatus 500 can be reduced.

The threshold value may be set through the Set feature command. Therefore, the host apparatus 500 can arbitrarily determine whether or not the refresh processing is performed based on the extent of deterioration in the memory cell. For example, if a threshold value is set to be low, a frequency of the refresh processings increases, but an error occurrence possibility can be reduced. On the other hand, if a threshold value is set to be slightly high, a frequency of the refresh processings can be reduced. A threshold value may be initially set to be low so that an error occurrence possibility is reduced, and the threshold value may be set to be slightly high when the frequency of the refresh processings exceeds a predetermined frequency. As described above, operation performance of the memory system 1 can be set depending on a user's request, and thus a user's convenience can be improved.

2. Second Embodiment

Next, a memory system according to a second embodiment will be described. In the present embodiment, instead of using the information (BFS) indicating whether or not the number of error bits exceeds a predetermined threshold value in the first embodiment, the number of error bits generated in a reading target page is output to a host apparatus in the sector unit. Hereinafter, only differences from the first embodiment will be described.

2.1 Feature Table

First, a feature table according to the present embodiment will be described with reference to FIG. 23. FIG. 23 conceptually illustrates the feature table according to the present embodiment. As illustrated, the feature table includes two entries, and each entry has an 8-bit length. The entries are respectively allocated with addresses "40h" and "50h".

BFR0 to BFR7 are held, in order, from the lowest bit in the entry related to the address "40h", BFR8 to BFR15 are held, in order, from the lowest bit in the entry related to the address "50h". Sector numbers and the number of error bits are indicated by BFR0 to BFR15.

In other words, first, BFR0 to BFR3 indicate the number of error bits detected in the sector 0 through a combination of values thereof, for example, as illustrated in FIG. 24. In other words, if (BFR3, BFR2, BFR1, BFR0)="0000", this indicates that no bit error is detected in the sector 0. "0001" indicates that the number of error bits in the sector 0 is one, and "0010" indicates that the number of error bits is two, and the same applies hereafter. "1111" indicates that error bits exceeding the correction performance of the built-in ECC circuit are generated (in this example, if error bits exceed 8 bits, the BFRs are "1111").

BFR4 to BFR7 indicate the number of error bits detected in the sector 1; BFR8 to BFR11 indicate the number of error bits detected in the sector 2; and BFR12 to BFR15 indicate the number of error bits detected in the sector 3.

2.2 Flow of Reading Operation

Next, a flow of the reading operation will be described with reference to FIG. 25. FIG. 25 is a flowchart illustrating operations of the host apparatus 500, the controller 200, and the NAND-type flash memory 100 during the reading operation. Hereinafter, only differences from the reading operation according to the first embodiment, which is described with reference to FIG. 21, will be described.

As illustrated, if the controller 200 receives the number of error bits in each sector from the NAND-type flash memory 100, for example, the sequencer 250 sets the received number of error bits in the feature table for each sector (step S40).

Next, the host apparatus 500 issues the Get feature command CMD_GF and the addresses ADD (="40h" and "50h"), and reads information regarding an entry including BFR from the feature table.

2.3 Advantage of Present Embodiment

Also in the present embodiment, the same effect as in the first embodiment can be achieved. According to the present embodiment, the host apparatus 500 can read the number of error bits (BFR) generated in each sector by using the Get feature command. Therefore, the host apparatus 500 can recognize a state of the memory cell more in detail, and thus the NAND-type flash memory 100 can be controlled more properly.

3. Modification Examples and the Like

As mentioned above, the memory system according to each of the above-described embodiments includes the first pin (pin No. 1 in FIG. 4) that can receive the chip select signal (/CS in FIG. 4) from the host apparatus; the second pin (pin No. 2 in FIG. 4) that can output the first signal (SO in FIG. 4) to the host apparatus; the third pin (pin No. 5 in FIG. 4) that can receive the second signal (SI in FIG. 4) from the host apparatus; the fourth pin (pin No. 6 in FIG. 4) that can receive the clock (SCK in FIG. 4) from the host apparatus; the interface circuit (210 or 220 in FIG. 6) that recognizes, as a command, the second signal which is received by the third pin immediately after the asserted chip select signal is received; the memory cell array (100 in FIG. 6) that includes the memory cell which can hold data and from which the data is read in the page unit; and the error detection circuit (400 in FIG. 7) that detects an error of the data read from the memory cell array. In the read data in the page unit, errors are detected in the plurality of first units (sectors) into which the page unit is divided. The interface circuit can transmit information (BFS in FIGS. 17 to 19) indicating that the number of error bits detected in anyone of the first units exceeds a predetermined threshold value (BFD in FIG. 17) from the second pin to the host apparatus.

Alternatively, the interface circuit can transmit the number of error bits (BFR in FIGS. 23 and 24) detected in each first unit to the host apparatus.

According to the present configuration, the host apparatus can obtain various kinds of information regarding an ECC processing during a reading operation, using the Get feature command. Consequently, the host apparatus can easily determine whether or not the refresh operation is necessary, and thus a load on the host apparatus can be reduced.

Figure 26:
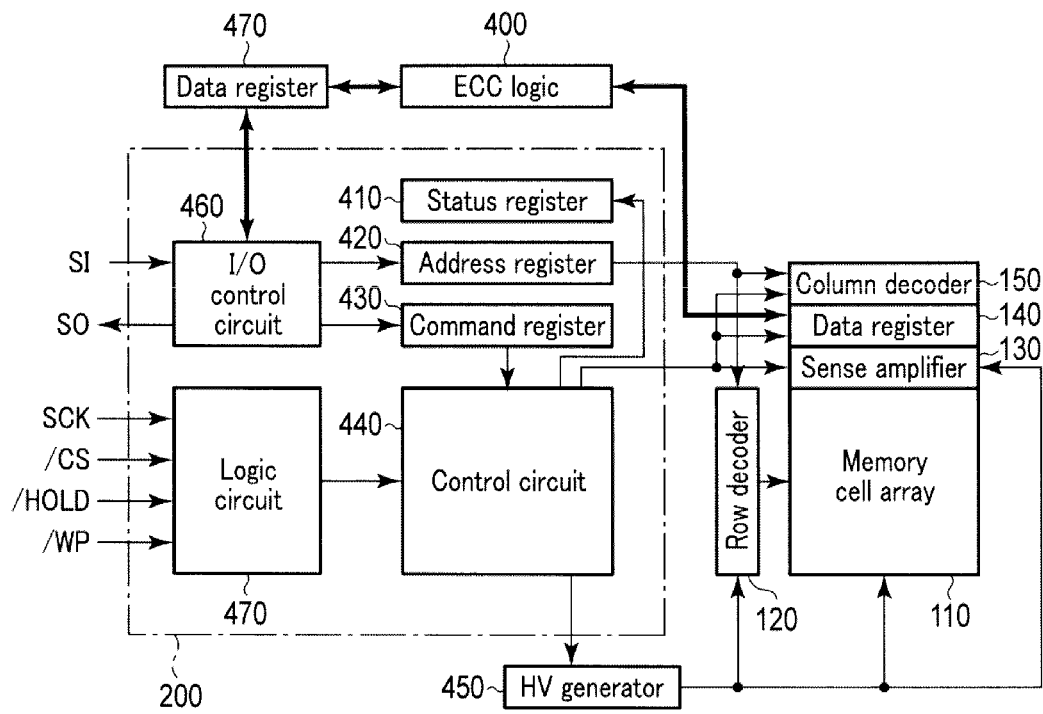
FIG. 26 is a block diagram of a memory system according to a modification example of the first and second embodiments.

Embodiments are not limited to the above-described embodiments and may have various modifications. For example, in the above-described embodiments, the NAND-type flash memory 100 and the controller chip 200 are separate semiconductor chips. However, the elements may be formed of one chip. FIG. 26 is a block diagram of the memory system 1 in this case.

As illustrated, a block configuration is the same as in FIG. 7, but the signals SCK, /CS, /HOLD, and/WP from the host apparatus 500 are input to the logic circuit 470, and the signals SI and SO are input and output via the input/output control circuit 460. The registers 410 and 430, the control circuits 440 and 460, and the logic circuit 470 function as the controller 200. In other words, the control circuit 440 functions as the sequencer 250 and the host interface circuit 220, and recognizes commands from the host apparatus 500 from each other, using the signal /CS. The input/output control circuit 460 and the logic circuit 470 function as the host input/output circuit 210. The registers 410 and 420 function as the registers 280 and 290, and the feature table is held in, for example, the status register 410 or the like.

In the configuration described with reference to FIGS. 6 and 7, the ECC circuit 400 may be included in the controller chip 200. In other words, the controller 200 may detect and correct an error. In this case, for example, the sequencer 250 may function as the ECC circuit 400.

The respective processings in the above-described flowcharts may be changed in order of the processings as appropriate. For example, in FIG. 21 or the like, the Get feature command for reading information regarding an ECC processing result may be issued at arbitrary timing, and may be issued, for example, before the second reading command CMD_RD2 is issued.

In the above-described embodiments, the BFS in the feature table indicates whether or not the number of generated error bits is equal to or more than a threshold value. Alternatively, the BFS may indicate whether or not the number of error bits exceeds the threshold value.

In the first embodiment, the number of error bits is compared with a threshold value in the sector unit. Alternatively, the totaling unit of the number of error bits compared with a threshold value designated by the BFD may be any unit (first unit) obtained by dividing, for example, one page. In other words, the totaling unit of the number of error bits is not limited to the sector unit. For example, a data size including a plurality of sectors may be set as a single first unit, a total number of error bits detected in the data size may be compared with a threshold value, and a result thereof may be indicated by the BFS. Of course, a total number of error bits generated in a data size with no relation to a sector may be compared with a threshold value.

The timing charts described in the above embodiments are only examples. The number of clocks which are required to input the signal SI or the number of clocks which are required to output the signal SO are not limited to those in the above embodiments. In the above embodiment, dummy bits are input immediately after a command is issued depending on the command. However, input of a command is not limited thereto. This is also the same for the feature table, and is not limited to the form described in the embodiments as long as the information described in the embodiments can be held therein.

The first and second embodiments may be arbitrarily combined with each other. A feature table in this case is obtained by combining the feature tables illustrated in FIGS. 17 and 23, and has five entries.

Figure 27:
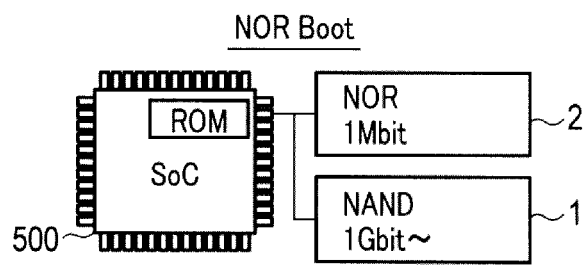
FIGS. 27 and 28 are each a conceptual diagram of a system using the memory systems according to the first and second embodiments.

The memory systems described in each of the above embodiments may be applied to, for example, a television set or a set top box. FIG. 27 illustrates an example of such a system. In the present example, a NOR-type flash memory 2 is provided in addition to the memory system 1. Both the memory system 1 and the NOR-type flash memory 2 are connected to an SPI interface. In the present example, commands (the commands CMD_RD1, CMD_RD2, CMD_GF, and CMD_SF, and the like) for controlling the memory system. 1 are held in the NOR-type flash memory 2. During activation of the host apparatus 500, the host apparatus 500 reads the command information from the NOR-type flash memory 2 according to a sequence held in a ROM of the host apparatus 500. The host apparatus 500 reads an activation sequence from the memory system 1 by using the command information, and the application is activated by executing the activation sequence.

Figure 28:
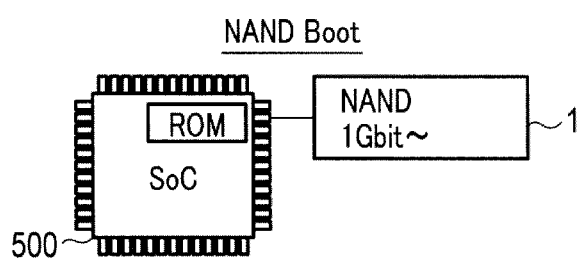

Alternatively, if the command information regarding the memory system 1 is held in the ROM of the host apparatus 500, the NOR-type flash memory 2 may be omitted as illustrated in FIG. 28.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device, comprising:
   a semiconductor memory unit;
   a controller configured to communicate with a host through a serial interface and read data stored in a page of the semiconductor memory unit in response to a read command received through the serial interface, the page being divided into unit regions; and
   an error-correcting code (ECC) circuit configured to carry out error correction with respect to data read from each unit region of the page for up to a maximum number of error bits for each unit region of the page and to detect a total number of error bits in the data read for each unit region of the page, wherein
   the controller is further configured to transmit, through the serial interface to the host, information that indicates whether or not the total number of error bits detected in the data read from each unit region of the page by the ECC circuit is greater than a predetermined value that is less than the maximum number of error bits per unit region.

2. The memory device according to claim 1, wherein the controller is further configured to determine whether or not the total number of error bits detected by the ECC circuit in the data read from each unit region of the page is greater than the predetermined value.

3. The memory device according to claim 1, wherein the controller includes a storage region in which operational settings of the memory device are stored, the operational settings including a first entry indicating the predetermined value and a second entry that stores the information.

4. The memory device according to claim 3, wherein the predetermined value in the first entry is settable through a command received from the host through the serial interface.

5. The memory device according to claim 3, wherein the controller transmits the information to the host in response to a command to read the second entry, which is received through the serial interface.

6. The memory device according to claim 1, wherein the unit region corresponds to a sector.

7. The memory device according to claim 1, wherein the serial interface conforms to Serial Peripheral Interface (SPI).

8. The memory device according to claim 1, further comprising:
a first pin through which a chip select signal can be received;
a second pin through which a clock signal can be received; and
a third pin through which a command can be received in synchronization with the clock signal, wherein
the controller recognizes a signal received by the third pin immediately after the chip select signal is asserted as a command.

9. A memory device, comprising:
a semiconductor memory unit;
a controller configured to communicate with a host through a serial interface and read data stored in a page of the semiconductor memory unit in response to a read command received through the serial interface, the page being divide into unit regions; and
an error-correcting code (ECC) circuit configured to carry out error correction with respect to data read from each unit region of the page and detect a number of error bits in data read from each unit region of the page, wherein
the controller is further configured to transmit, through the serial interface to the host, the number of error bits detected by the ECC circuit in the data read from each unit region of the page.

10. The memory device according to claim 9, wherein
the number of error bits detected by the ECC circuit in the data read from each unit region of the page is stored in the memory device, and
the controller transmits the number to the host, in response to a command to read the number, which is received through the serial interface.

11. The memory device according to claim 9, wherein the unit region corresponds to a sector.

12. The memory device according to claim 9, wherein the serial interface conforms to Serial Peripheral Interface (SPI).

13. The memory device according to claim 9, further comprising:
a first pin through which a chip select signal can be received;
a second pin through which a clock signal can be received; and
a third pin through which a command can be received in synchronization with the clock signal, wherein
the controller recognizes a signal received by the third pin immediately after the chip select signal is asserted as a command.

14. A method of informing a host whether or not a refresh process should be carried out in a memory device having a semiconductor memory unit and a controller configured to communicate with the host through a serial interface and read data stored in a page of the semiconductor memory unit in response to a read command received through the serial interface, said method comprising:
performing a read operation on a page in the semiconductor memory unit;
performing error correction with respect to data read from each unit region of the page; and
transmit through the serial interface to the host, information that indicates whether or not a number of error bits detected in the data read from each unit region of the page through the error correction is greater than a predetermined value.

15. The method according to claim 14, further comprising:
determining whether or not a number of error bits detected in the data read from each unit region of the page through the error correction is greater than a predetermined value; and
setting the information in accordance with the determination.

16. The method according to claim 14, wherein
the controller includes a storage region in which operational settings of the memory device are stored, the operational settings including a first entry indicating the predetermined value and a second entry that stores the information.

17. The method according to claim 16, further comprising:
setting the predetermined value in the first entry in response to a command received from the host through the serial interface.

18. The method according to claim 16, wherein
the information is transmitted to the host, in response to a command to read the second entry, which is received through the serial interface.

19. The method according to claim 14, wherein the unit region corresponds to a sector.

20. The method according to claim 14, wherein
the memory device further includes a first pin configured to receive through which a chip select signal is received, a second pin through which a clock signal is received, and a third pin through which a command is received in synchronization with the clock signal, and
the controller recognizes a signal received by the third pin immediately after the chip select signal is asserted as a command.

* * * * *